(12) United States Patent
Senoo et al.

(10) Patent No.: US 10,665,304 B2
(45) Date of Patent: May 26, 2020

(54) SEMICONDUCTOR MEMORY DEVICE AND METHODS FOR OPERATING A SEMICONDUCTOR MEMORY DEVICE

(71) Applicant: Winbond Electronics Corp., Taichung (TW)

(72) Inventors: Makoto Senoo, Taichung (TW); Hiroki Murakami, Taichung (TW); Kazuki Yamauchi, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/209,115

(22) Filed: Dec. 4, 2018

(65) Prior Publication Data

US 2019/0237148 A1    Aug. 1, 2019

(30) Foreign Application Priority Data

Jan. 30, 2018   (JP) .................... 2018-013326

(51) Int. Cl.
| | |
|---|---|
| *G11C 7/10* | (2006.01) |
| *G11C 16/32* | (2006.01) |
| *G11C 16/04* | (2006.01) |
| *G11C 16/30* | (2006.01) |
| *G11C 16/08* | (2006.01) |
| *G11C 16/10* | (2006.01) |
| *G11C 7/22* | (2006.01) |

(Continued)

(52) U.S. Cl.
CPC .............. *G11C 16/32* (2013.01); *G11C 7/222* (2013.01); *G11C 7/225* (2013.01); *G11C 16/0483* (2013.01); *G11C 16/08* (2013.01); *G11C 16/10* (2013.01); *G11C 16/26* (2013.01); *G11C 16/30* (2013.01); *G11C 7/20* (2013.01)

(58) Field of Classification Search
CPC ..... G11C 16/32; G11C 16/0483; G11C 16/08; G11C 16/10; G11C 16/26; G11C 7/222; G11C 7/225; G11C 7/20

See application file for complete search history.

(56) References Cited

U.S. PATENT DOCUMENTS 7,433,247 B2    10/2008 Zheng et al.
7,558,114 B2 *  7/2009 Lee .................... G11C 16/3418
                                            365/185.11

(Continued)

FOREIGN PATENT DOCUMENTS

| TW | 201518931 A | 5/2015 |
|---|---|---|
| WO | WO2011/060248 A2 | 5/2011 |

*Primary Examiner* — Toan K Le

(74) *Attorney, Agent, or Firm* — Muncy, Geissler, Olds & Lowe, PC

(57) ABSTRACT

A semiconductor memory device which is able to perform a power sequence with high reliability is provided. When a power from an external device is supplied, the controller of the flash memory of the invention is configured to read codes stored in a read-only memory in synchronization with a clock signal to perform a power-on sequence. In addition, the controller is further configured to deactivate the clock signal so as to pause the power-on sequence when it has been detected during the power-on sequence that the voltage of the power is not greater than a threshold, and to activate the clock signal to resume the power-on sequence when it is detected that the voltage of the supplied power exceeds the threshold again.

12 Claims, 6 Drawing Sheets

(51) Int. Cl.
    *G11C 16/26*    (2006.01)
    *G11C 7/20*     (2006.01)

(56) References Cited

U.S. PATENT DOCUMENTS

| | | |
|---|---|---|
| 9,112,488 B2 * | 8/2015 | Murakami ......... H03K 19/0016 |
| 9,395,795 B2 * | 7/2016 | Warren ................... G06F 1/325 |
| 9,557,763 B2 | 1/2017 | Bucci |
| 2013/0265838 A1 | 10/2013 | Li |
| 2013/0265841 A1 | 10/2013 | Duzly et al. |

* cited by examiner

SEMICONDUCTOR MEMORY DEVICE AND METHODS FOR OPERATING A SEMICONDUCTOR MEMORY DEVICE

CROSS REFERENCE TO RELATED APPLICATIONS

This application claims priority of Japanese Patent Application No. 2018-013326, filed on Jan. 30, 2018, the entirety of which is incorporated by reference herein.

BACKGROUND OF THE INVENTION

Field of the Invention

The invention relates to a semiconductor memory device, such as a flash memory, and more particularly to a power-on sequence of the semiconductor memory device.

Description of the Related Art

For a semiconductor memory device, such as an NAND type flash memory, information regarding the settings of the read voltage, the program voltage, the erase voltage, or others, and the user's options are stored in the fuse cell of the memory cell array. Generally, a fuse cell is configured in a storage area that cannot be accessed by the user. When the memory device is powered on in a power-on sequence, the flash memory controller is configured to read the setting information stored in the fuse cell and load the setting information to the corresponding devices, such as configuration registers. After the power-on sequence, the controller controls the operations which are performed based on the setting information stored in the configuration registers.

For example, Reference 1 discloses that the power-on sequence of a memory device, where the non-volatile memory device determines whether the data utilized for a pre-check read from the fuse cell is consistent with the pre-check data, stores the configuration information read from the main fuse cell in the non-volatile memory area, and determines whether the data utilized for a post-check read from the fuse cell is consistent with the post-check data. When the pre-check data and post-check data are both consistent with the data read from the main fuse cell, the read operation for reading configuration information from the fuse cell is ended.

REFERENCE

Reference 1: U.S. Pat. No. 7,433,247.

BRIEF SUMMARY OF THE INVENTION

Problems to be Solved

When power is supplied, the voltage level for starting the power-on sequence is set to a level that is slightly lower than a guaranteed level for normal operations. This is for cases where the supplied power increases extremely slowly when power is supplied and the voltage level for starting the power-on sequence is around the lower limit for the chip to detect the supplied power, and the power-on sequence must be activated by this level. In addition, if the voltage level for starting the power-on sequence is set to a level that is higher than the guaranteed level for normal operation, the time required for the power-on sequence increases. Therefore, setting the level slightly lower than the guaranteed level for normal operation may help prevent the power-on and power-off conditions from being repeatedly detected due to fluctuations in the voltage level when power is supplied.

As discussed above, in the semiconductor memory device, such as a flash memory, when the power-on sequence is performed, reading the fuse cell is the same as reading a normal memory cell array, and both are controlled by the Central Control Unit (CPU) based on the command codes stored in the read only memory (ROM). That is, in order to read the codes from the ROM, a clock signal is utilized and the charge pump generating the voltage required for the read operation is activated when reading data from the fuse cell. Meanwhile, the bit line at which the read operation is performed is pre-charged. These operations generate noises and peak current. Therefore, the power Vcc sometimes drops temporarily or suddenly.

If the ROM codes is read under the condition when the power Vcc drops, the problems of insufficient operation margin of the sense circuit, unstable clock signal, or being unable to read correct program codes from the ROM may occur. FIG. 1 shows such an example. During the period between time T1 and time T2, the power Vcc is higher than a certain level, and the CPU reads the program codes (for example, the CPU performs the read operations in response to the rising edges of the clock signal CPU CLK) from the ROM and controls the read operations of the fuse cell. When the power Vcc drops during the period between time T2 and time T3, the read operation of the fuse cell becomes unstable. In other words, the codes cannot be correctly read from the ROM, causing unexpected operations or suspension of the read operation. The problem of power Vcc drop is especially significant for memory which operates at a low voltage (for example, Vcc is 1.8V), because the operation margin is slim. As discussed above, if the power Vcc drops during the power-on sequence, it is difficult to guarantee a reliable power-on sequence, resulting in abnormality or failure of the power-on sequence.

An object of the invention is to solve the conventional problems discussed above, and provide a semiconductor memory device that is capable of performing the power-on sequence with higher reliability than the conventional design.

Apparatuses and Methods for Solving Problems

According to an embodiment of the invention, a method for operating a semiconductor memory device is disclosed. The semiconductor memory device comprises a controller configured to control operations of a memory cell array. When external power is supplied, the controller is configured to perform a power-on sequence by reading codes stored in a read-only memory in synchronization with a clock signal. When the voltage level of the supplied power drops below a threshold voltage during the power-on sequence, the controller is configured to deactivate the clock signal, so as to pause or suspend the power-on sequence. When the voltage level of the supplied power again exceeds the threshold voltage, the controller is configured to activate the clock signal, so as to resume the power-on sequence.

According to an embodiment of the invention, a semiconductor memory device is disclosed. The semiconductor memory device comprises a memory cell array, a controller configured to control operations of the memory cell array and an external terminal. The controller comprises an execution device, a detection device and a control device. When a power is supplied to the external terminal, the execution device is configured to perform a power-on sequence by reading codes stored in a read-only memory in synchronization with a clock signal. The detection device is configured to detect the voltage level of the supplied power. The control device is configured to control the execution device according to a detection result from the detection device. During the period when the voltage level of the supplied power drops below a threshold voltage, the control device is configured to deactivate the clock signal, so as to pause the power-on sequence.

Effect of the Invention

According to an embodiment of the invention, when the level of the supplied power drops below a threshold voltage, the power-on sequence is stopped. When the level of the supplied power again exceeds the threshold voltage, the power-on sequence is resumed. The reliability of the power-on sequence can be improved by the operation described above, and unstable or erroneous operation can be prevented.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
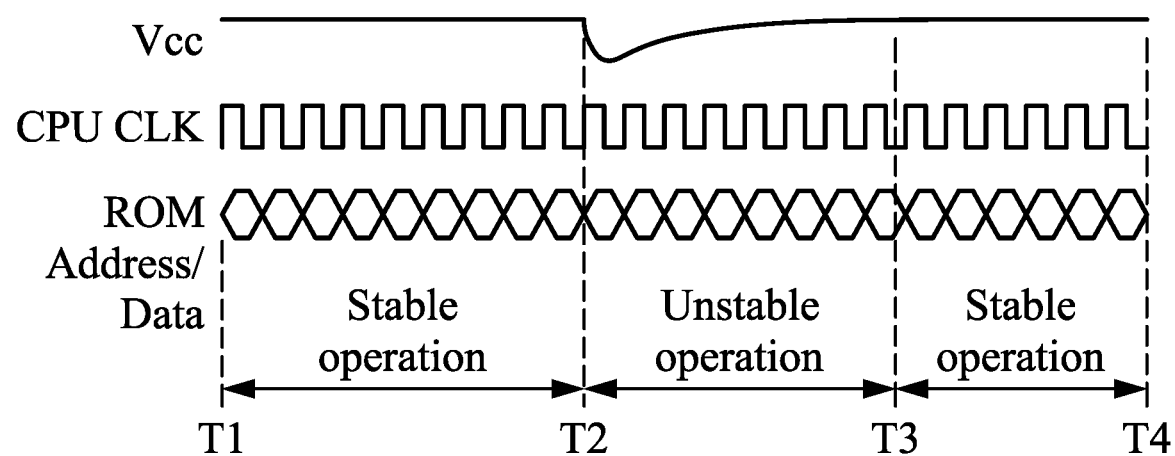
FIG. 1 is a timing diagram of reading the ROM codes during the power-on sequence in the prior art.

The following description is of the best-contemplated mode of carrying out the invention. This description is made for the purpose of illustrating the general principles of the invention and should not be taken in a limiting sense. The scope of the invention is best determined by reference to the appended claims.

Hereinafter, embodiments of the invention will be described in detail with reference to the drawings. Herein, a NAND type flash memory is taken as a preferred exemplary form. In addition, although the parts are emphasized in the drawings for easy understanding of the invention, it must be noted that the contents of the drawings are not necessarily the same as those of the actual device.

EMBODIMENTS

Figure 2:
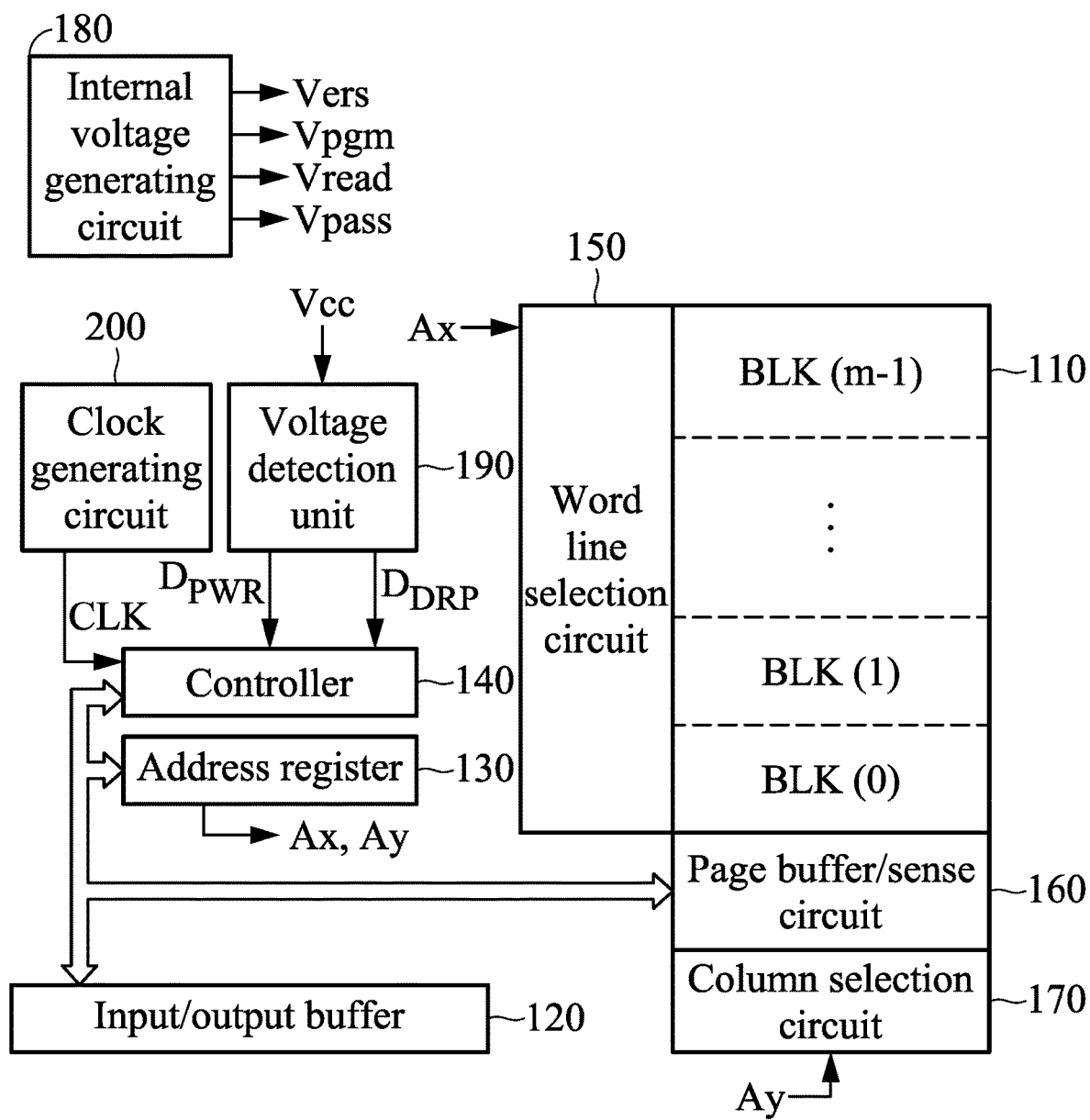
FIG. 2 shows the internal structure of a main portion of a flash memory according to an embodiment of the invention.

Referring to FIG. 2, according to an embodiment of the invention, the flash memory 100 may comprise a memory cell array 110, an input/output buffer 120, an address register 130, a controller 140, a word line selection circuit 150, a page buffer/sense circuit 160, a column selection circuit 170, an internal voltage generating circuit 180, a voltage detection unit 190 and a clock generating circuit 200. The memory cell array 110 comprises a plurality of memory cells arranged in a form of an array. The input/output buffer 120 is connected to an external input/output terminal. The address register 130 is configured to receive address data from the input/output buffer 120. The controller 140 is configured to receive command data from the input/output buffer 120 and control operations of each device. The word line selection circuit 150 is configured to receive information regarding row address Ax from the address register 130, decode the information regarding row address Ax and perform block or word line selection based on the decoded result. The page buffer/sense circuit 160 is configured to maintain the data read from the page selected by the word line selection circuit 150 and maintain the input data to be programmed into the selected page. The column selection circuit 170 is configured to receive information regarding column address Ay from the address register 130, decode the information regarding column address Ay and select the column address data in the page buffer/sense circuit 160 based on the decoded result. The internal voltage generating circuit 180 is configured to generate a variety of voltages required for reading data, programming data, erasing data, and so on (such as the program voltage Vpgm, the pass voltage Vpass, the read pass voltage Vread, the erase voltage Vers . . . etc.). The voltage detection unit 190 is configured to monitor the power Vcc supplied by the external terminal and detect the voltage level of the power Vcc. The clock generating circuit 200 is configured to generate the clock signal CLK.

The flash memory 100 comprises m memory blocks BLK(0), BLK(1), . . . BLK(m−1) in the column direction. There are multiple NAND storage units formed in a memory block, where the NAND storage unit comprises a plurality of memory cells coupled in serial. In addition, the memory cell array 110 comprises a fuse cell for storing information regarding voltage settings required for different flash memory operations and user options. The fuse cell is in the storage area that cannot be accessed by the user.

Figure 3:
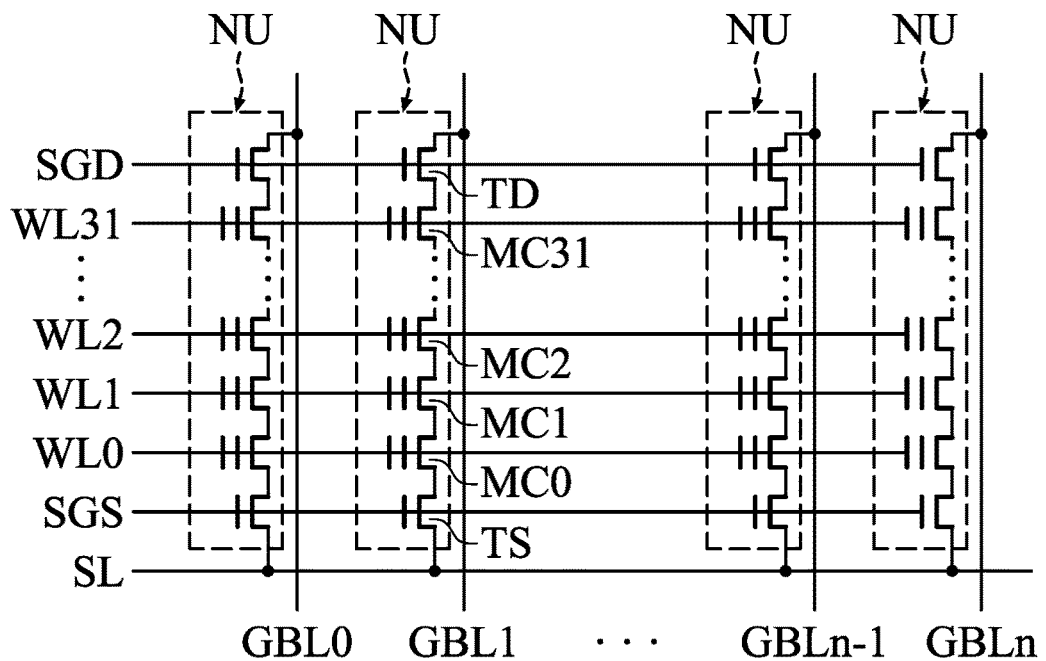
FIG. 3 shows the structure of the NAND storage units of a memory cell array.

Referring to FIG. 3, the NAND storage unit NU comprises a plurality of memory cells MCi (where i=0, 1, . . . 31) coupled in serial, a bit-line side selection transistor TD coupled to the drain electrode of the memory cell MC31 and a source side selection transistor TS coupled to the source electrode of the memory cell MC0. The drain electrode of the bit-line side selection transistor TD is coupled to a corresponding bit line GBL (such as the bit line GBL0, GBL1, . . . , GBLn−1, GBLn). The source electrode of the source side selection transistor TS is coupled to the common source line SL.

Typically, the memory cell has a MOS structure. The MOS structure comprises the N-type diffusion region drain/source electrode formed in the P-well, the tunnel oxide formed on the channel between the source/drain electrodes, the floating gate formed on the tunnel oxide, and the control gate formed on the floating gate via the dielectric film. The memory cell may be the single level cell which stores one-bit data (binary data), or may be the multiple level cell which stores multi-bit data.

The control gate of the memory cell MCi is coupled to the word line WLi, the gate electrodes of the selection transistors TD and TS are coupled to the selection gate lines SGD and SGS. The word line selection circuit 150 selectively drives the selection transistors TD and TS via the selection gate lines SGD and SGS according to the row address Ax and selectively drives the word lines WL0~WL31.

In the read operation, a correct voltage is applied to the bit lines, a specific voltage (for example, 0 volt) is applied to the selected word line, a pass voltage Vpass (for example, 4.5 volt) is applied to the unselected word lines, a correct voltage (for example, 4.5 volt) is applied to the selection gate lines SGD and SGS, the bit-line side selection transistor TD and the source side selection transistor TS are turned on, and 0 volt voltage is applied to the common source line SL. In the program (write) operation, a high (for example, 15~25 volt) program voltage Vpgm is applied to the selected word line, a medium (for example, 10 volt) voltage is applied to the unselected word line, such that the bit-line side selection transistor TD is turned on and the source side selection transistor TS is turned off, and the voltage corresponding to the data '0' or '1' is applied to the bit line GBL. In the erase operation, 0 volt voltage is applied to the selected word line in the block, a high voltage (for example, 20 volt) is applied to the P-well, and the data is erased in the unit of a block by drawing electrodes from the floating gate to the substrate.

The voltage detection unit 190 is configured to monitor the power Vcc supplied by the external terminal of the flash memory 100 and detect the voltage level of the power Vcc. When the voltage level of the power Vcc reaches the level of the power-on voltage, a power-on detection signal $D_{PWR}$ is outputted to the controller 140. The controller 140 determines that a power-on mode is entered and the power-on sequence is performed.

In addition, after detecting that the voltage level of the power Vcc reaches the level of the power-on voltage, the voltage detection unit 190 is configured to further detect the situations when the voltage level of the power Vcc drops temporarily below a threshold voltage due to noise or power consumption and when the voltage level of the power Vcc again exceeds the threshold voltage. The voltage detection unit 190 is configured to output a voltage drop detection signal $D_{DRP}$ indicating the detection result to the controller 140. For example, the voltage detection unit 190 may output the voltage drop detection signal $D_{DRP}$ having a high voltage level to the controller 140 when detecting that the voltage level of the power Vcc drops below the threshold voltage, and output the voltage drop detection signal $D_{DRP}$ having a low voltage level to the controller 140 when detecting that the voltage level of the power Vcc exceeds the threshold voltage. The threshold voltage may be set to a level that is lower than the level of the power Vcc or a target voltage and higher than the range of the voltage levels that are sufficient to maintain the power-on sequence (e.g. the power-on voltage or the power-off voltage).

Figure 4:
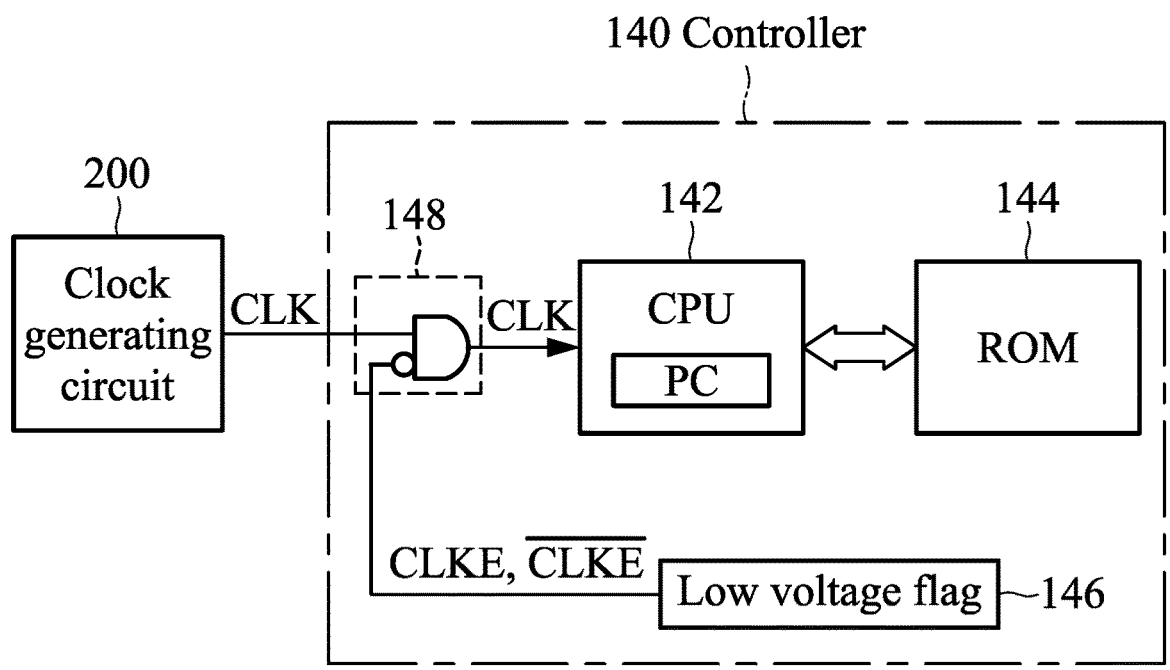
FIG. 4 shows the internal structure of a controller according to an embodiment of the invention.

As shown in FIG. 4, the controller 140 comprises the CPU 142 and the ROM 144, and the controller 140 operates in synchronization with the clock signal CLK. The codes for controlling the power-on sequence operations, the read operation, the program operation, the erase operation, or others, are stored in the ROM 144. The CPU 142 is configured to read the command codes from the ROM 144 in accordance with the address set in the program counter PC, decode the read command codes and control operations of the word line selection circuit 150, the page buffer/sense circuit 160, the internal voltage generating circuit 180, or others according to the decoded command codes. When executing a sequence of operations, the address set by the program counter PC will be increased or decreased in synchronization with the rising edges of the clock signal. In addition, the controller 140 may branch the address of the program counter based on the requirements.

When the controller 140 receives the power-on detection signal $D_{PWR}$ from the voltage detection unit 190, the power-on mode is entered and the power-on sequence is performed. The operations of the power-on sequence comprise reading the fuse cell of the memory cell array 110. The controller 140 is configured to load the voltage setting information and the specification information read from the fuse cell into the configuration registers. In addition, when performing the power-on sequence, the controller is configured to receive the voltage drop detection signal $D_{DRP}$ from the voltage detection unit 190 and set a low voltage flag 146 according to the content indicated by the voltage drop detection signal $D_{DRP}$.

The clock generating circuit 200 is configured to provide the clock signal CLK to the controller 140. The clock generating circuit 200 may generate the clock signal on the chip or may generate an internal clock signal based on an external clock signal provided by an external device. The controller 140 may comprise a clock control circuit 148. The clock control circuit 148 is configured to receive the clock signal CLK from the clock generating circuit 200 and output the clock signal CLK to the CPU 142 in response to the clock enable signals CLK and /CLKE. According to an embodiment of the invention, the clock control circuit 148 may comprise an AND gate. The AND gate receives the clock signal CLK generated by the clock generating circuit 200 and the clock enable signal which is obtained by inverting the logic held by the low voltage flag 146, and outputs an AND operation result thereof. When the low voltage flag 146 has a high voltage level, that is, when the voltage level of the power Vcc drops below the threshold voltage, the AND gate output a low voltage signal to the CPU 142, where the low voltage signal is the signal obtained by deactivating the clock signal CLK. On the other hand, when the low voltage flag 146 has a low voltage level, that is, when the voltage level of the power Vcc exceeds the threshold voltage, the AND gate activate the clock signal CLK signal and the clock signal CLK is provided to the CPU 142.

Figure 5:
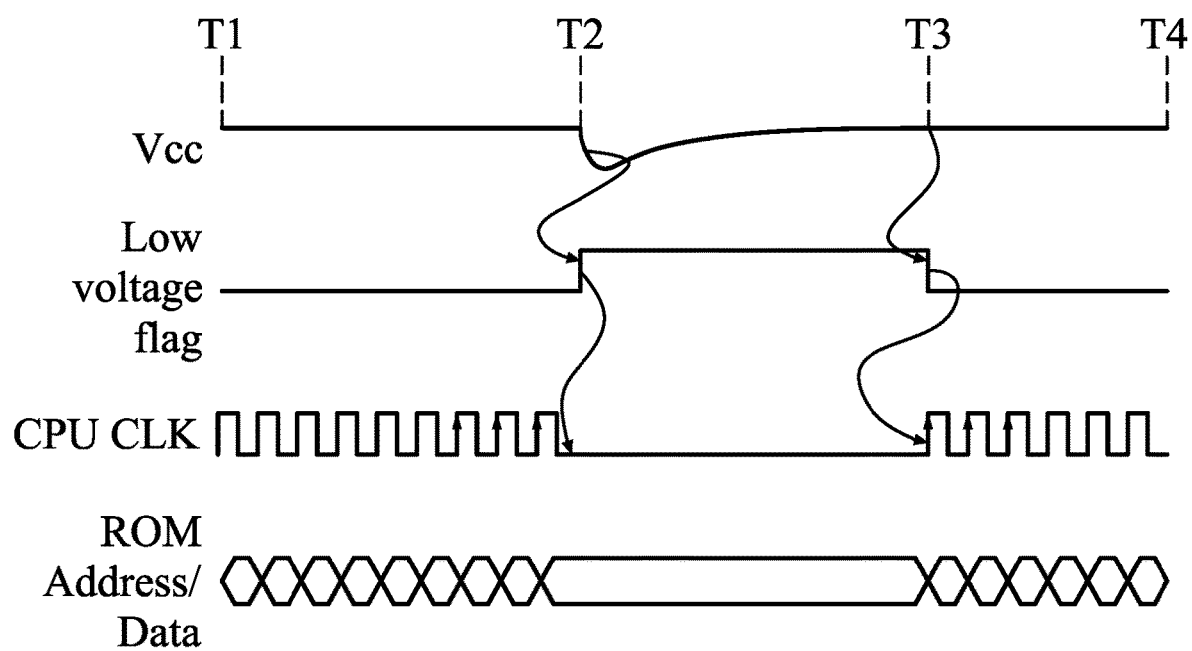
FIG. 5 is a timing diagram when reading the ROM codes during the power-on sequence according to a first embodiment of the invention.

FIG. 5 is a timing diagram when reading the ROM codes during the power-on sequence according to a first embodiment of the invention. In the following paragraphs, the power-on sequence of the embodiment will be illustrated based on the timing diagram shown in FIG. 5. As show in FIG. 5, in the power-on sequence after the power is supplied, the power Vcc drops between time T2 and time T3. Between time T1 and time T2, the voltage level of the power Vcc exceeds the threshold voltage, and the voltage drop detection signal $D_{DRP}$ output by the voltage detection unit 190 has a low voltage level. The controller 140 sets the low voltage flag 146 to a low voltage level. In response to the clock enable signal /CLKE obtained from the low voltage flag 146, the clock control circuit 148 activates the clock signal CLK and provides the clock signal CLK to the CPU 142. For example, the CPU 142 is configured to operate in synchronization with the rising edges of the clock signal CLK. That is, the CPU 142 reads a code from the ROM 144 in accordance with the address set in the program counter PC, decodes the read code and control operations of devices according to the decoded code. The program counter PC is increased in synchronization with the next rising edge of the clock signal CLK, and the CPU 142 reads a subsequent code from the ROM 144 and control operations of devices according to the decoded code.

At time T2, when the power Vcc drops below the threshold voltage, the voltage drop detection signal $D_{DRP}$ output by the voltage detection unit 190 has a high voltage level. In response to the voltage drop detection signal $D_{DRP}$, the controller 140 sets the low voltage flag 146 to a high voltage level, the clock control circuit 148 deactivates the clock signal CLK in response to the clock enable signal CLKE and thus provides a low voltage signal to the CPU 142. Thereby, the clock signal CLK is not provided to the CPU 142, and the operation of the CPU 142 is actually stopped.

At time T3, once the power Vcc increases and exceeds the threshold voltage, the voltage drop detection signal $D_{DRP}$ output by the voltage detection unit 190 turns to a low voltage level. In response to the voltage drop detection signal $D_{DRP}$, the controller 140 sets the low voltage flag 146 to a low voltage level. In response to the clock enable signal /CLKE, the clock control circuit 148 activates the clock signal CLK and provides the clock signal CLK to the CPU 142. Once the clock signal CLK is provided to the CPU 142, the CPU 142 reads the code from the ROM 144 in accordance with the address held by the program counter PC and restarts its operation.

As discussed above, according to the embodiment of the invention, during the power-on procedure, when the voltage drop of the supplied power Vcc has been detected, the clock signal CLK is deactivated to stop the CPU from reading the ROM codes. When the voltage level of the supplied power Vcc again exceeds the threshold voltage, the clock signal CLK is activated to resume the operation of reading the ROM codes of the CPU. In this manner, the read operation of reading the fuse cell during the power-on sequence is stable and the failure rate of performing the power-on sequence is reduced. In addition, since the clock signal is deactivated and the operation of the CPU is suspended when the supplied power Vcc drops, the total power consumed when performing the power-on sequence is reduced.

A second embodiment of the invention will be discussed in the following paragraphs. When the supplied power Vcc drops, the operation of the CPU 142 is stopped. Depending on the operation that has been stopped, it is sometimes not desirable to resume the operation as it was. Reading the fuse cell is the same as reading a normal memory cell array, which includes a pre-charge operation for pre-charging the bit line. The period to pre-charge the bit line is managed by the number of clock pulses from the clock signal CLK. If the operation of the CPU is stopped while the bit line is being pre-charged, and then the operation of the CPU is restarted, the actual bit line pre-charge time may become longer than the time that is usually required. In other words, right before the operation of the CPU 142 is to be stopped, the bit line is pre-charged via the executed codes and the number of clock pulses is counted. Then, the pre-charged operation is suspended. After that, when the operation of the CPU 142 is restarted by executing the same codes, the problem of charging one bit line that has already been pre-charged, again, occurs, and the counting of the number of clock pulses begins, too. In order to prevent the above-mentioned problem from occurring, in the second embodiment of the invention, when it is inappropriate to restart the operation being performed when the power-on sequence was suspended, the controller 140 may branch the address of the program counter so that the power-on sequence can resume from another operation that was not affected by the suspension. For example, in a situation where the power-on sequence was stopped when the bit-line was being pre-charged, the address set by the program counter may be modified in order not to lengthen the bit line pre-charge time. One way to modify the address is to make the CPU resume the power-on sequence by restarting another operation prior to the bit line pre-charge operation. According to an embodiment of the invention, the operation to be restarted may be set in advance.

Figure 6:
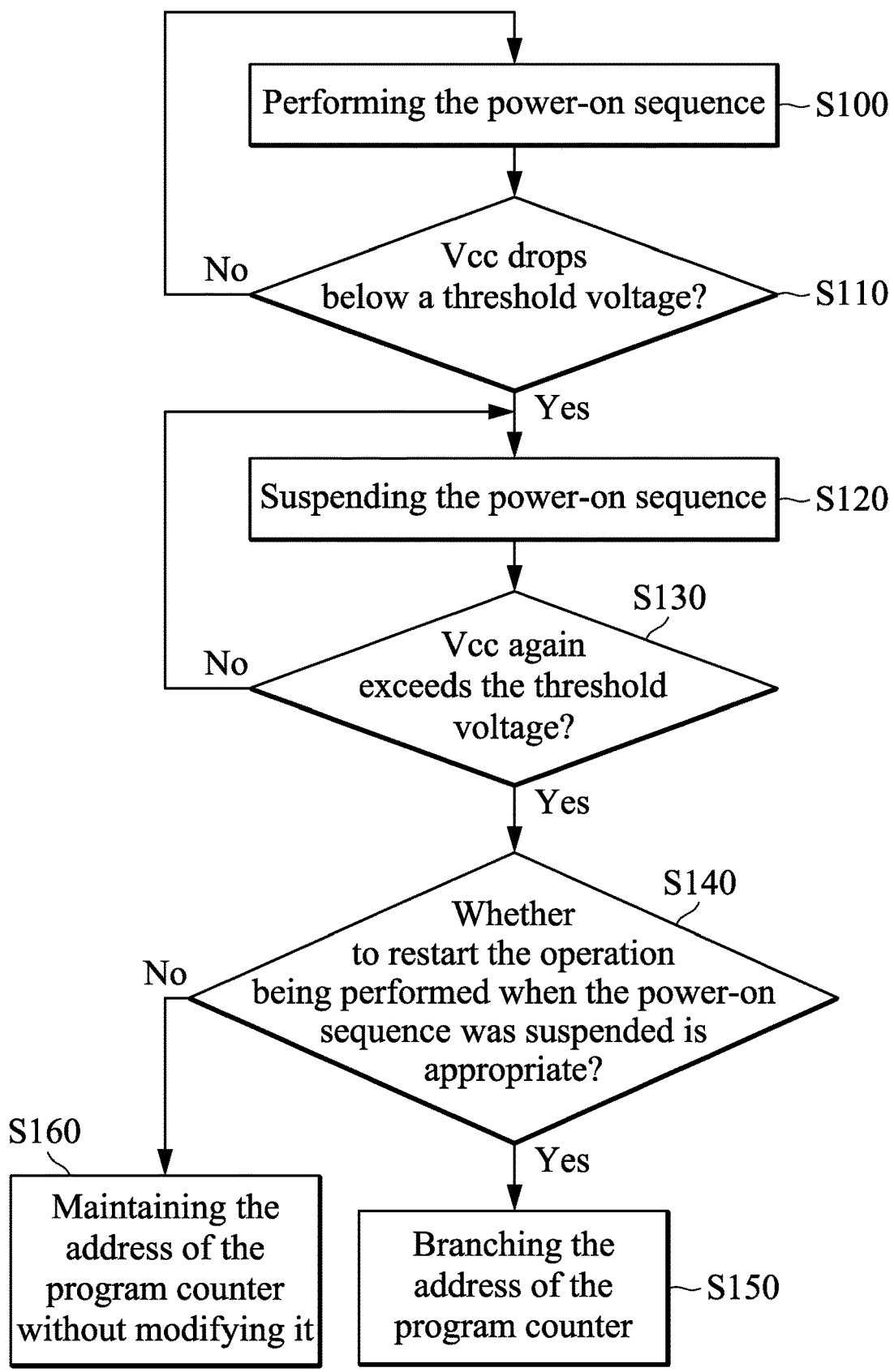
FIG. 6 is an exemplary flow chart of a power-on sequence according to a second embodiment of the invention.

Referring to FIG. 6, when the power is supplied to the flash memory and when the level of the power-on voltage is detected by the voltage detection unit 190, the controller 140 is configured to perform the power-on sequence according to the power-on detection signal $D_{PWR}$ (Step S100). Next, when the power Vcc drops below a threshold voltage (Step S110), the clock signal is deactivated and the power-on sequence performed by the CPU 142 is suspended (Step S120). Next, when the power Vcc exceeds the threshold voltage, again (Step S130), the controller 140 is configured to determine whether to restart the operation being performed when the power-on sequence was suspended is appropriate (Step S140). To be more specific, the controller 140 may determine whether the address set by the program counter PC is consistent with a predetermined address. If so, the controller 140 determines that to restart the operation being performed when the power-on sequence was suspended is inappropriate. In this condition, the controller 140 may branch the address of the program counter to the address of another operation that will not make the resumption of the power-on sequence become inappropriate. In the embodiment discussed above, for example, the address of the program counter is changed to another operation prior to the bit line pre-charge (Step S150). For example, the mapping relationships of the addresses of the operations when the power-on sequence was suspended and the corresponding branched address may be predefined in a mapping table. The controller 140 may look up or consult the mapping table to modify the address of the program counter. When a restart of the operation being performed when the power-on sequence was suspended is determined appropriate in step S140, then the address of the program counter will not be modified (Step S160).

As discussed above, the controller 140 suspends the operations of the CPU and then resumes the operations of the CPU. The embodiments of the invention can help avoid inconsistency between the operation being performed when the power-on sequence was suspended and the operation that is restarted when the power-on sequence is resumed.

A third embodiment of the invention will be discussed in the following paragraphs. During the power-on procedure, if the power Vcc drops several times, the possibility of power-on failure increases and unnecessary power will be consumed. Therefore, in the third embodiment of the invention, when the number of times that the voltage level of the supplied power drops below the threshold voltage is equal to a predetermined number, the power-on sequence is resumed by restarting from another operation with lower power consumption or less noise.

Figure 7:
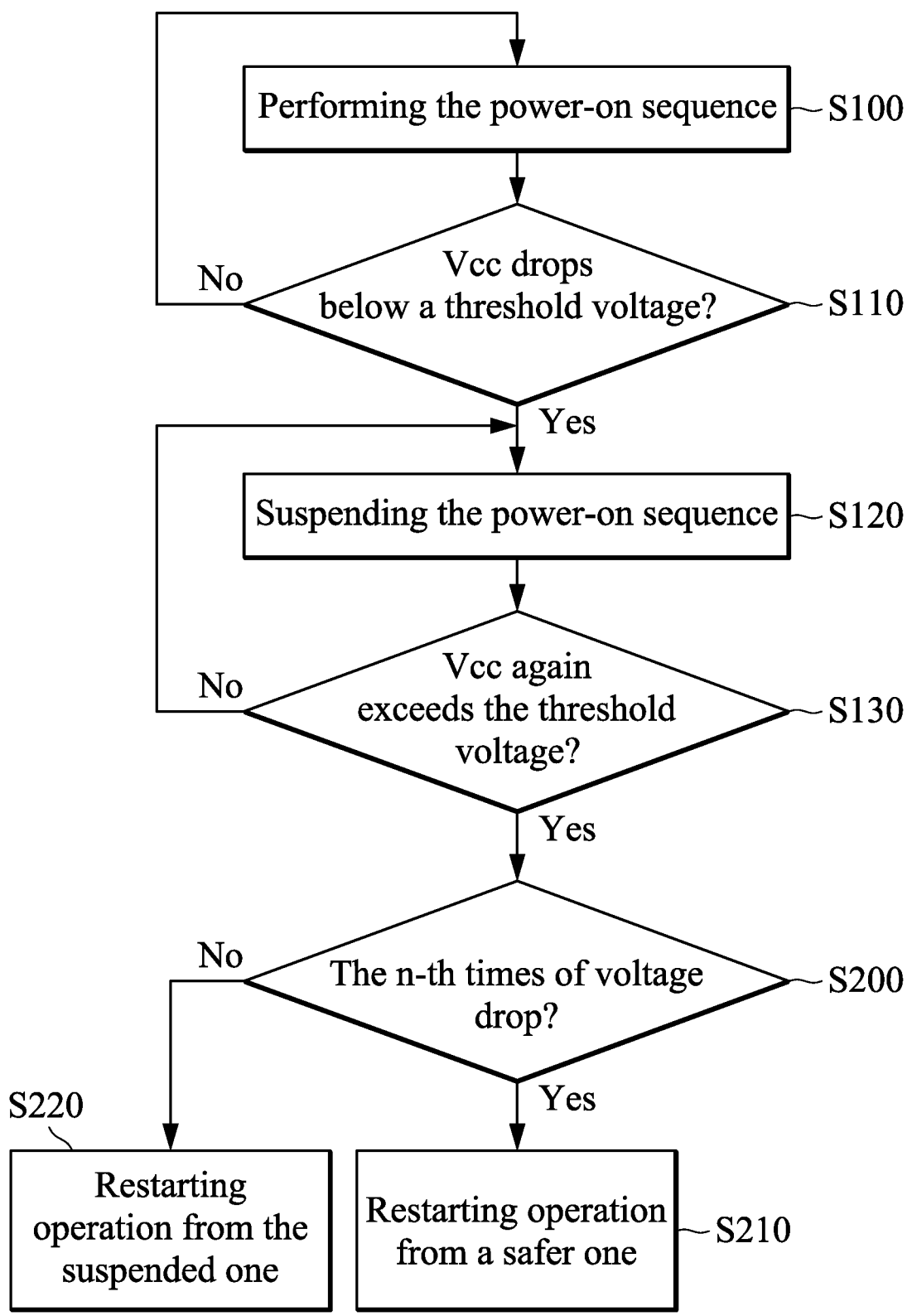
FIG. 7 is an exemplary flow chart of a power-on sequence according to a second embodiment of the invention.

Referring to FIG. 7, steps S100 to S130 are the same as the second embodiment and are omitted here for brevity. The controller 140 records the number of times that the voltage level of the power Vcc has dropped below the threshold voltage, or it records the number of times that the voltage level of the power Vcc has returned to a level that exceeds the threshold voltage. When resuming the operation of the power-on sequence, the controller 140 is configured to determine whether the number of times that the voltage level of the power Vcc has dropped is equal to a predetermined number n, wherein n is a positive integer greater than 1 (Step S200). When the power Vcc has dropped n times, the controller 140 modifies the address of the program counter to restart the operation from a safer one with lower power consumption (Step S210). On the other hand, when the number of times that the voltage level of the power Vcc has dropped is not equal to the predetermined number n, the controller 140 will not modify the address of the program counter and the power-on sequence will be resumed by restarting the operation that was being performed when the power-on sequence was suspended (Step S220).

As discussed above, based on the embodiments of the invention, when the number of times that the voltage has dropped reaches a predetermined number, the operation is restarted from a safer one with lower power consumption. In this manner, the time required to complete the power-on sequence will be reduced, and unnecessary power consumption will be avoided.

Although the above embodiments are exemplified by a NAND type flash memory, the invention is not limited thereto. The embodiment of the invention is also applicable to other semiconductor memory devices in which the power-on sequence is executed by a CPU.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A method for operating a semiconductor memory device, the semiconductor memory device comprising a controller configured to control operations of a memory cell array, the method comprising:
    performing the following steps by the controller:
    performing a power-on sequence by reading codes stored in a read-only memory in synchronization with a clock signal when a power is supplied by an external device;
    deactivating the clock signal to suspend the power-on sequence when a voltage level of the supplied power drops below a threshold voltage; and
    activating the clock signal to resume the power-on sequence when the voltage level of the supplied power again exceeds the threshold voltage.

2. The method as claimed in claim 1, further comprising:
    when resuming the power-on sequence, determining, by the controller, whether an operation being performed when the power-on sequence was suspended is consistent with a pre-determined operation; and
    when the operation being performed when the power-on sequence was suspended is consistent with the pre-determined operation, resuming, by the controller, the power-on sequence from a beginning of the operation that was being performed when the power-on sequence was suspended.

3. The method as claimed in claim 2, further comprising:
    modifying, by the controller, an address set by a program counter when the power-on sequence was suspended.

4. The method as claimed in claim 1, further comprising:
    when resuming the power-on sequence, determining, by the controller, whether an operation being performed when the power-on sequence was suspended is consistent with a pre-determined operation; and
    when the operation being performed when the power-on sequence was suspended is consistent with the pre-determined operation, resuming, by the controller, the power-on sequence by performing another operation that is different from the operation that was being performed when the power-on sequence was suspended.

5. The method as claimed in claim 1, wherein the controller comprises a program counter configured to set an address of the read-only memory, and the power-on sequence is resumed in accordance with the address set by the program counter.

6. The method as claimed in claim 1, wherein the power-on sequence comprises reading setting information from a pre-determined area of the memory cell array.

7. A semiconductor memory device, comprising:
    a memory cell array;
    a controller, configured to control operations of the memory cell array; and
    an external terminal,
    wherein the controller comprises:
    an execution device, configured to perform a power-on sequence by reading codes stored in a read-only memory in synchronization with a clock signal when a power is supplied to the external terminal;
    a detection device, configured to detect a voltage level of the supplied power; and
    a control device, configured to control the execution device according to a detection result from the detection device, wherein during a period when the voltage level of the supplied power drops below a threshold voltage, the control device is configured to deactivate the clock signal, so as to suspend the power-on sequence.

8. The semiconductor memory device as claimed in claim 7, wherein the control device is further configured to activate the clock signal when the voltage level of the supplied power again exceeds the threshold voltage, so as to resume the power-on sequence.

9. The semiconductor memory device as claimed in claim 7, wherein when resuming the power-on sequence, the control device is configured to resume the power-on sequence from a beginning of an operation being performed when the power-on sequence was suspended when the operation being performed when the power-on sequence was suspended is determined to have been consistent with a pre-determined operation.

10. The semiconductor memory device as claimed in claim 9, wherein when a number of times that the voltage level of the supplied power drops below the threshold voltage is equal to a predetermined number, the control device determines that it is inappropriate to resume the power-on sequence from the beginning of the operation being performed when the power-on sequence was suspended.

11. The semiconductor memory device as claimed in claim 7, wherein when resuming the power-on sequence, the control device is configured to resume the power-on sequence by performing another operation that is different from an operation that was being performed when the power-on sequence was suspended when the operation that was being performed when the power-on sequence that was suspended is determined to have been consistent with a pre-determined operation.

12. The semiconductor memory device as claimed in claim 7, wherein the controller comprises a program counter configured to set an address of the read-only memory, and the control device is further configured to determine whether to resume the power-on sequence from a beginning of an operation being performed when the power-on sequence was suspended is appropriate, and when control device determines that to resume the power-on sequence from the beginning of the operation being performed when the power-on sequence was suspended is inappropriate, the controller is further configured to modify the address set by the program counter when the power-on sequence was suspended.

* * * * *